United States Patent
Boca

(10) Patent No.: US 10,931,237 B2
(45) Date of Patent: Feb. 23, 2021

(54) RF AMPLIFIER HAVING MAXIMUM EFFICIENCY AND SWR PROTECTION FEATURES AND METHODS FOR PROVIDING MAXIMUM EFFICIENCY RF AMPLIFICATION

(71) Applicant: Ranko Boca, Igalo (ME)

(72) Inventor: Ranko Boca, Igalo (ME)

(*) Notice: Subject to any disclaimer, the term of this patent is extended or adjusted under 35 U.S.C. 154(b) by 31 days.

(21) Appl. No.: 16/404,668

(22) Filed: May 6, 2019

(65) Prior Publication Data

US 2020/0350864 A1    Nov. 5, 2020

Related U.S. Application Data

(60) Provisional application No. 62/841,159, filed on Apr. 30, 2019.

(51) Int. Cl.
| | |
|---|---|
| *H03F 1/26* | (2006.01) |
| *H03F 1/02* | (2006.01) |
| *H03F 3/21* | (2006.01) |
| *H03F 3/193* | (2006.01) |

(52) U.S. Cl.
CPC ........... *H03F 1/0222* (2013.01); *H03F 3/193* (2013.01); *H03F 3/211* (2013.01)

(58) Field of Classification Search
CPC ......... H03F 1/0222; H03F 3/193; H03F 3/211
USPC .......................... 330/149, 136; 375/296, 297
See application file for complete search history.

(56) References Cited

U.S. PATENT DOCUMENTS

| | | | |
|---|---|---|---|
| 7,551,688 B2 * | 6/2009 | Matero | H03F 1/0227 330/199 |
| 8,909,175 B1 * | 12/2014 | McCallister | H04L 27/368 455/114.3 |

* cited by examiner

*Primary Examiner* — Khanh V Nguyen
*Assistant Examiner* — Khiem D Nguyen
(74) *Attorney, Agent, or Firm* — Kenneth D'Alessandro

(57) ABSTRACT

A method for increasing efficiency of a radio frequency (RF) amplifier employing laterally diffused metal oxide semiconductor (LDMOS) transistors coupled to an RF exciter including determining an emission mode of modulated RF input signals generated by the exciter, if the emission mode is of a type where the modulated RF input signals have a continuously varying envelope, biasing the LDMOS transistors in the RF amplifier for linear operation, and if the emission mode is of a type where the modulated RF input signals do not have a continuously varying envelope, biasing the LDMOS transistors in the RF amplifier with a fixed quiescent drain current and a fixed drain supply voltage for the LDMOS transistors selected to cause the LDMOS transistors to operate in compression.

8 Claims, 7 Drawing Sheets

Drain Efficiency vs. CW Output Power
Gain and Drain-Source Voltage

Gain ------
Drain Efficiency —·—·—

| Drain Source Voltage (V) | Gain (dB) | Efficiency (%) | Output Power (Watts) | Dissipation (Watts) |
|---|---|---|---|---|
| 65 | 32.5 | 60 | 1000 | 666 |
| 57.5 | 31.5 | 68 | 1000 | 470 |
| 50 | 29.5 | 77 | 1000 | 298 |

RF AMPLIFIER HAVING MAXIMUM EFFICIENCY AND SWR PROTECTION FEATURES AND METHODS FOR PROVIDING MAXIMUM EFFICIENCY RF AMPLIFICATION

The present invention relates to radio frequency (RF) amplifiers. More particularly, the present invention relates to RF amplifiers that employ laterally diffused metal oxide (LDMOS) transistors as amplifying elements and to such RF amplifiers that are driven using RF input signals having multiple different modulation modes and that adjust the amplifier power supply voltage for maximum efficiency in response to sensing certain ones of the modulation modes of the input RF signals and further the invention relates to providing enhanced protection for high standing wave ratio (SWR) conditions.

BACKGROUND

Laterally diffused metal oxide (LDMOS) transistor devices have found wide use in RF power amplifier designs requiring high output power and drain-to-source breakdown voltages in excess of 120V. Such RF power amplifiers have often been designed to operate at reduced power levels and lower efficiency in order to maintain good output signal linearity for signals having high peak-to-average signal envelope variations.

It is known to use adaptive biasing to continually adjust the gain of LDMOS-based RF amplifiers as a function of real-time variations in an input signal in order to maintain a higher level of amplifier efficiency. Examples of such amplifier designs are found in U.S. Pat. Nos. 7,986,186, 9,385,665, and 10,003,309. Other representative examples of such designs include Vaidya et al., *High Power Amplifier designed with LDMOS: A Review*, International Journal of Advanced Research in Computer Science and Electronics Engineering, Vol. 3, Issue 7, July 2014, pp. 363-366; Hegarty, *Improving RF power amplifier efficiency in 5G radio systems using an adjustable DC/DC buck regulator*, Texas Instruments TI Tech Notes, SNVA802—September 2018—Revised February 2019.

z

BRIEF DESCRIPTION

According to an aspect of the present invention, a method for increasing efficiency of a radio frequency (RF) amplifier employing laterally diffused metal oxide semiconductor (LDMOS) transistors coupled to an RF exciter includes determining an emission mode of modulated RF input signals generated by the exciter, if the emission mode is of a type where the modulated RF input signals have a continuously varying envelope, biasing the LDMOS transistors in the RF amplifier for linear operation, and if the emission mode is of a type where the modulated RF input signals do not have a continuously varying envelope, biasing the LDMOS transistors in the RF amplifier with a fixed quiescent drain current and a fixed drain supply voltage for the LDMOS transistors selected to cause the LDMOS transistors to operate in compression.

According to an aspect of the present invention, biasing the LDMOS transistors in the RF amplifier in compression comprises biasing the LDMOS transistors at a 3 dB compression point more or less.

According to an aspect of the present invention, determining an emission mode of modulated RF signals generated by the exciter comprises decoding an emission identifier signal communicated to the RF amplifier from the exciter.

According to an aspect of the present invention, determining an emission mode of modulated RF signals generated by the exciter comprises processing the modulated RF input signals generated by the exciter to determine the emission mode.

According to an aspect of the present invention, biasing the LDMOS transistors in the RF amplifier in compression comprises selecting a drain supply voltage for the LDMOS transistors as a function of drive power of the RF modulated input signals and desired amplifier output power.

According to an aspect of the invention, an RF amplifier includes an amplifier using a LDMOS transistor as an amplifying element, a variable bias circuit coupled to the amplifier to provide a bias current to the LDMOS transistor, a variable power supply coupled to the amplifier to provide a drain voltage to the LDMOS transistor, and a digital signal processing (DSP) unit coupled to the variable bias circuit and to the variable power supply, the DSP unit responsive to the type of emission provided to the RF amplifier from an exciter to cause the variable bias circuit to set one of a first bias current and a second bias current larger than the first bias current to the LDMOS transistor, and to cause the variable power supply to supply one of a first drain voltage and a second drain voltage larger than the first drain voltage to the LDMOS transistor in response to the type of emission provided to the RF amplifier from the exciter, the first bias current and first drain voltage selected for non-linear mode emissions and the second bias current and second drain voltage selected for linear mode emissions.

According to an aspect of the invention, the DSP unit is responsive to emission mode data supplied by the exciter to cause the variable bias circuit to set one of the first bias current and the second bias current larger than the first bias current to the LDMOS transistor and cause the variable power supply to supply one of a first drain voltage and a second drain voltage larger than the first drain voltage to the LDMOS transistor in response to the type of emission provided to the RF amplifier from the exciter.

According to an aspect of the invention, the DSP unit analyzes RF emission provided by the exciter to cause the variable bias circuit to set one of the first bias current and the second bias current larger than the first bias current to the LDMOS transistor and cause the variable power supply to supply one of a first drain voltage and a second drain voltage larger than the first drain voltage to the LDMOS transistor in response to the type of emission provided to the RF amplifier from the exciter.

BRIEF DESCRIPTION OF THE DRAWING FIGURES

The invention will be explained in more detail in the following with reference to embodiments and to the drawing in which are shown:

DETAILED DESCRIPTION

Persons of ordinary skill in the art will realize that the following description is illustrative only and not in any way limiting. Other embodiments will readily suggest themselves to such skilled persons.

Figure 1:
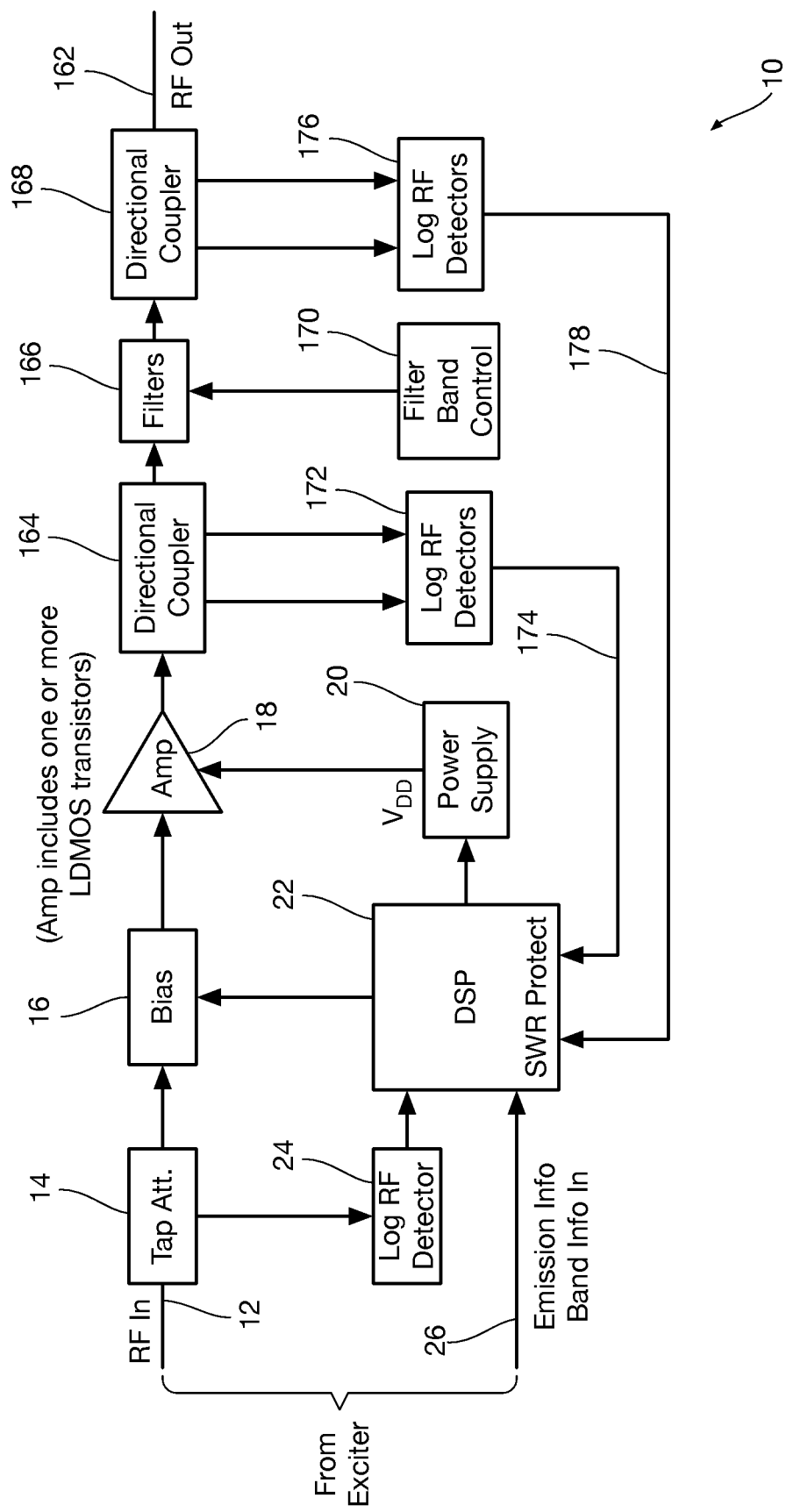
FIG. 1 is a block diagram of an RF amplifier in accordance with an aspect of the present invention.

Referring first of all to FIG. 1, a block diagram shows an RF amplifier 10 in accordance with an aspect of the present invention. An RF signal is fed to the amplifier 10 on input line 12 and passes to a tap attenuator 14. The tap attenuator 14 attenuates the magnitude of the input RF signal as necessary to avoid overdriving and possibly damaging the amplifier. In any given amplifier design, the maximum input drive is specified and the tap attenuator 14 inserts an amount of attenuation if necessary to maintain the of the amplifier in a linear operating region. Design of such tap attenuators is known in the art.

The output from the tap attenuator 14 is fed to the bias circuit 16. The bias circuit 16 sets the quiescent value of drain current $I_{DQ}$ of the amplifier 18 which it feeds. The amplifier 18 is formed from one or more LDMOS devices. Configuration of RF amplifiers using LDMOS devices is known in the art. The drain voltage $V_{DD}$ for the LDMOS transistors in the amplifier 18 is provided by the power supply 20.

In accordance with an aspect of the present invention, the power supply 20 is configured to vary the drain voltage $V_{DD}$ for the LDMOS transistors in the amplifier 18 in accordance with the present invention in the manner disclosed herein. The drain voltage output ($V_{DD}$) of the power supply 20 as well as the level of quiescent bias current ($I_{DQ}$) set by the bias circuit 16 is controlled by the digital signal processor (DSP) unit 22. The DSP unit 22 analyzes an output signal from a log RF detector 24 and uses it to control the power supply 20 and the bias circuit 16 in accordance with the present invention. The log RF detector 24 monitors the RF input signal from the tap attenuator and in some embodiments of the invention the DSP unit 22 analyzes the output of the log RF detector 24 in order to determine the emission (modulation) type of the RF input signal that is being presented on the input line 12. In other embodiments of the invention the exciter provides data to the RF amplifier 10 on the emission and band data line 26 that identifies the emission type.

One of the characteristics of LDMOS transistors is that they have a tendency to go into compression, where a small percentage increase of current and output power results in a steep increase in operating efficiency. A compression of 3 dB increases the efficiency by about 10-15%, depending on the particular LDMOS device used. In accordance with the present invention, this property of the LDMOS transistors is very useful for modulation types where compression and linearity are not that important such as FM, CW and digital modes. In this way less heat is dissipated, transistors operate at lower temperatures, allowing the use of smaller heat sinks. This allows the entire amplifier to be smaller, more robust and less expensive.

Figures 2, 3:
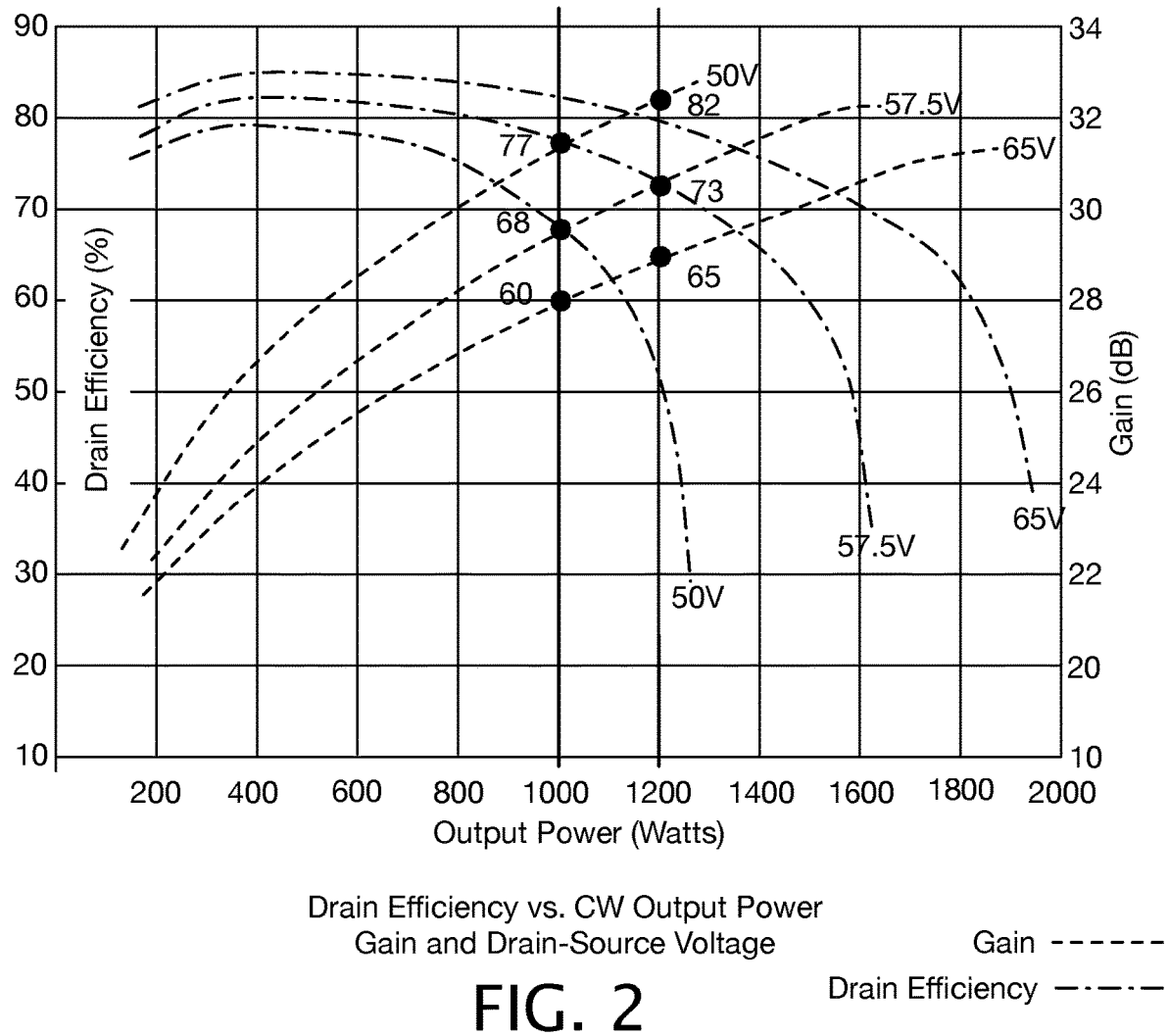
FIG. 2 is a graph that shows an example of achieving the same power and increase in efficiency of an LDMOS transistor amplifier by using different $V_{DD}$ power supply voltages and gains.
FIG. 3 is a table that shows optimal parameters for the BLF188 LDMOS transistor at a desired output of 1000 W.

Referring now to FIG. 2, a graph shows an example of achieving the same power and increase in efficiency of an LDMOS transistor amplifier by using different $V_{DD}$ values and gain.

The characteristics shown in FIG. 2 are for an LDMOS transistor BLF188. As may be seen from an examination of FIG. 2, a transistor output power of 1000 W can be achieved by operating the transistor at different $V_{DD}$ values with different gain values that result in significant differences in amplifier efficiency. FIG. 3 is a table that summarizes optimum results achieved when there is about 3 dB of compression and the voltage is lowered to a value that reaches the targeted output power. At an output power of 100 W, optimum operating parameters for the BLF188 is a $V_{DD}$ voltage of about 50V with the transistor gain set to about 29.5 dB (3 dB compression point). From FIGS. 2 and 3 it is seen that the device dissipation is reduced from 666 W at a $V_{DD}$ value of 65V to 298 W at a $V_{DD}$ value of 65V. This is a 55% decrease. The particular LDMOS transistor used to generate the characteristics shown in the graphs herein is only a non-limiting example of the many LDMOS transistors that may be used in RF amplifiers in accordance with the present invention. Persons of ordinary skill in the art will readily be able to choose a LDMOS transistor that is suitable for any particular RF amplifier design.

The present invention uses this property of the LDMOS transistor to control $V_{DD}$ values depending on the level of drive power. By doing this it is possible to keep the LDMOS transistor in a region of higher efficiency, which is not the case with a fixed $V_{DD}$ value.

In contrast to the expensive and complex prior-art methods of increasing LDMOS transistor efficiency such as use of dynamically modulated power supplies, the methods of the present invention regulate $V_{DD}$ power supply voltage values in relation to the drive power level. The drive level is measured and the $V_{DD}$ power supply voltage value is set automatically for certain types of modulation that are not as dynamic as emission types such as amplitude modulation (AM) single side band (SSB) for example.

First the envelope of the input signal is analyzed and a decision is made on activating the optimal working class of the transistor by choosing the quiescent current $I_{DQ}$. If the signal type is such that the efficiency of the amplifier can be maximized by use of the techniques of the present invention, then the optimal level of $V_{DD}$ power supply voltage is set based on the measured power of the input drive, allowing the LDMOS transistor to operate in the optimal region of efficiency.

In accordance with an aspect of the invention, modulated RF signals having a continuous envelope, e.g., AM and SSB, are amplified by the RF amplifier using an operating mode that provides maximum linearity instead and the maximum efficiency mode of operation of the present invention is not active.

The present invention is implemented by controlling the $V_{DD}$ voltage output voltage of the power supply using commands sent via a protocol such as the I2C protocol. These commands are sent by a microcontroller that also measures the level of drive power.

The system and method of the present invention measures the momentary values of the input signal by using a logarithmic detector. The signals are then digitalized by an analog-to-digital converter (ADC) and the LDMOS transistor input gain is derived by using a mathematical and statistical analysis. The mode of operation (linear vs. compression) is then set as well as the optimal output voltage and working class of the power supply.

Figure 4:
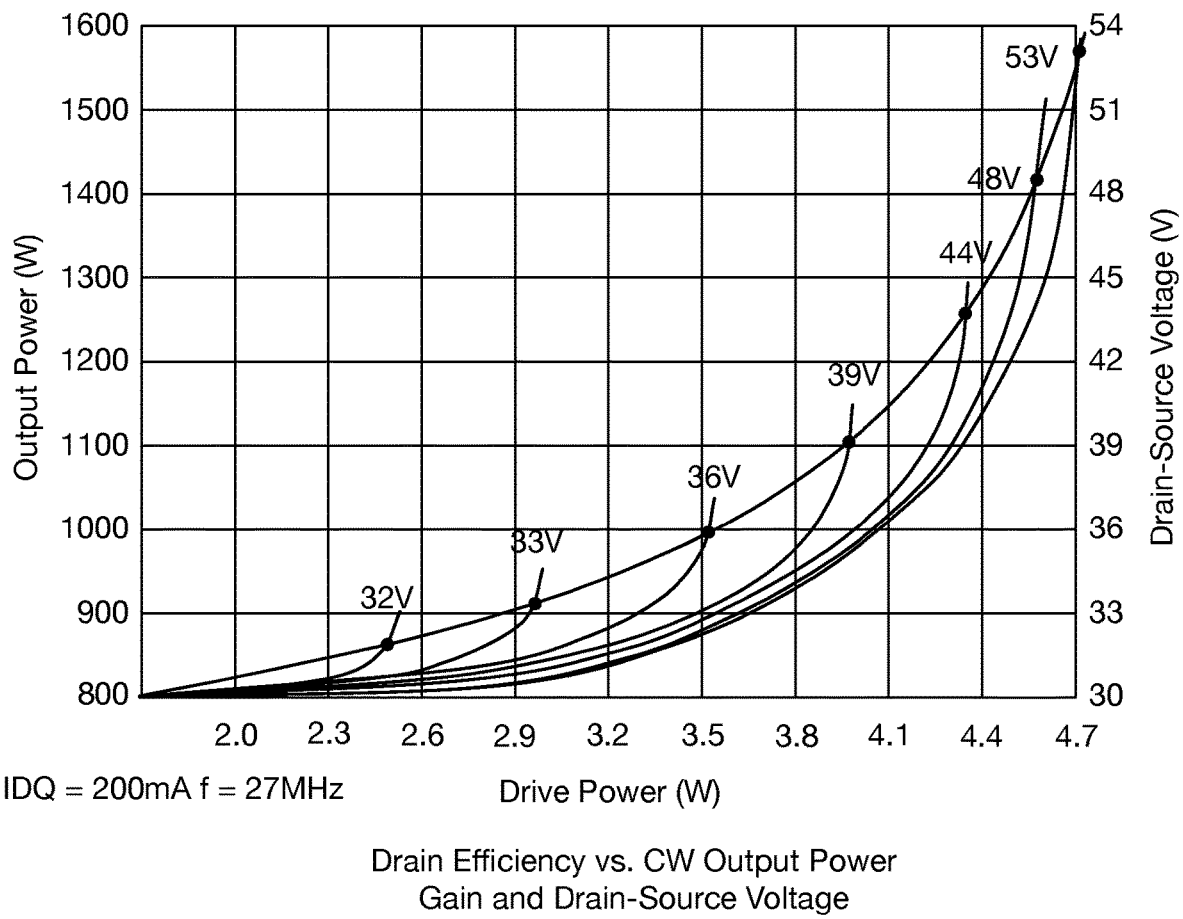
FIG. 4 is a graph that shows an example of setting values of $V_{DD}$ in relation to the level of gain to maintain a desired value of compression.

Referring now to FIG. 4, a graph shows a non-limiting example of setting values of $V_{DD}$ in relation to the level of input signal to maintain a desired value of compression in accordance with an aspect of the invention. As can be seen from an examination of FIG. 4, for every increment in drive power $V_{DD}$ power supply voltage is re-set to the most efficient value by maintaining the gain compression at a constant value of about 3 dB. The $V_{DD}$ power supply voltage is controlled by a microcontroller that measures the level of drive power at the same time and adjusts VDD via a protocol such as the SMBUS (I2C) protocol.

In accordance with an aspect of the invention, there are four distinct modes of operation used to provide maximum efficiency of amplifier operation.

In accordance with the first mode of operation, the exciter that drives the amplifier sends information about the type of emission. In FIG. 1, emission information is shown provided from the exciter to the DSP controller 22 on line 26. The emission information may be encoded in any number of ways and indicates the type of emission being output by the exciter, such as CW, SSB, AM, FM, RTTY, and other digital modes. In this mode of operation, the DSP unit determines from the information sent by the exciter that modulated RF signals having a continuous envelope, e.g., either AM or SSB emission, are present then the $V_{DD}$ power supply voltage variability is deactivated.

In accordance with the second mode of operation, the exciter sends information about the type of emission, and the $V_{DD}$ power supply voltage variability is active. In this mode of operation, the DSP unit determines from the information sent by the exciter that one of certain types of modulated RF signals modulation that do not have a continuous envelope and are not as dynamic as emission types such as AM or SSB emission, are present then the $V_{DD}$ power supply voltage variability is activated.

In accordance with the third mode of operation, the exciter does not send information about the type of emission, and the envelope of the exciter signal is analyzed by the DSP unit. In this mode of operation, the analysis performed by the DSP unit determines that modulated RF signals having a continuous envelope, e.g., either AM or SSB emission, are present and the $V_{DD}$ power supply voltage variability is deactivated. This determination may be made may by determining that the modulated signal does not fall into the definition of binary amplitude shift keying or has a constant envelope, such as FM.

In accordance with the fourth mode of operation, the exciter does not send information about the type of emission, and the envelope of the exciter signal is analyzed by the DSP unit. In this mode of operation, the analysis performed by the DSP unit determines that one of certain types of modulated RF signals modulation that do not have a continuous envelope and are not as dynamic as emission types such as AM or SSB emission, are present and the $V_{DD}$ power supply voltage variability is activated. This mode of operation is used to amplify any modulated signal that falls into the definition of binary amplitude shift keying or has a constant envelope, such as FM or phase-shift keying (PSK).

Figure 5:
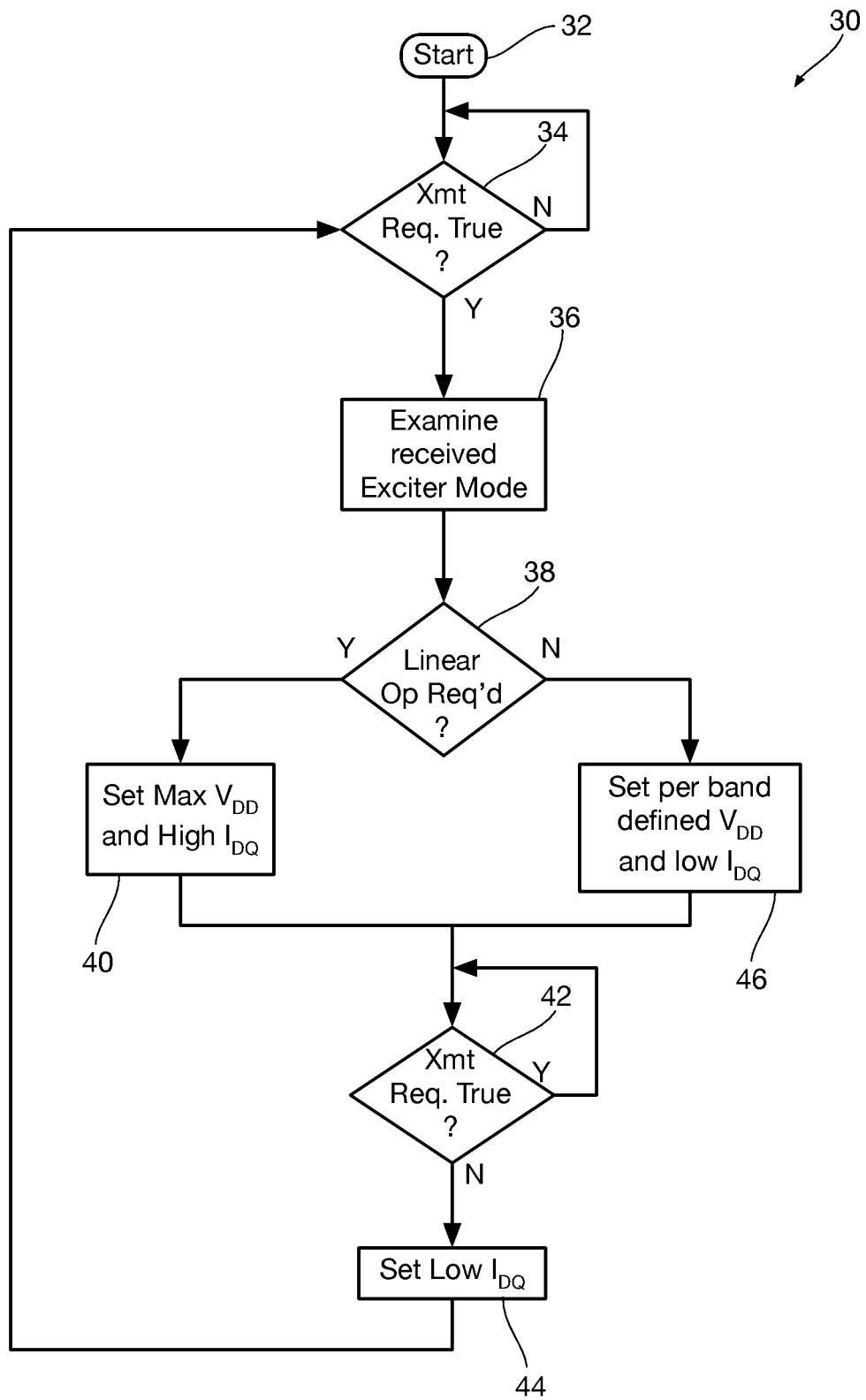
FIG. 5 is a flow diagram showing an illustrative method for operating an RF amplifier for maximum efficiency in accordance with an aspect of the invention.

Referring now to FIG. 5, a flow diagram showing an illustrative method 30 for operating an RF amplifier for maximum efficiency in accordance with an aspect of the invention. According to this method, upon a transmission request, the drain voltage and $I_{DQ}$ are set based on the type of emission reported by the exciter. If the type of emission allows operation in a non-linear mode, a lower $V_{DD}$ and lower $I_{DQ}$ are set. When the transmission ends a low $I_{DQ}$ mode (e.g., 1 A) is entered. The method begins at reference numeral 32.

At reference numeral 34 the method loops until a transmit request is made (i.e., is "True"). One way to determine if a transmit request is made is to monitor a push-to-talk (PTT) line that is commonly provided on the exciter that is generating the RF signal that is used to drive the RF amplifier 10. Such PTT lines are typically either pulled down to ground or are pulled up to a DC voltage above ground to provide an indication that transmission is taking place.

When the transmit request is True, the method proceeds to reference numeral 36 where the DSP unit examines the exciter mode information received from the exciter on line 26 shown in FIG. 1. At reference numeral 38 it is determined whether the received exciter mode information indicates an exciter mode that requires linear operation (e.g., AM or SSB). If it is determined that the exciter mode requires linear operation, the method proceeds to reference numeral 40 where the DSP unit 22 signals the power supply to set $V_{DD}$ to the maximum value and signals the bias circuit 16 to set a high $I_{DQ}$ value. In one exemplary embodiment of the invention where the amplifier employs the BLF 188 LDMOS transistor, the maximum $V_{DD}$ value is 52V and the high $I_{DQ}$ is set to 2 A. The particular values chosen for the maximum $V_{DD}$ value and the high $I_{DQ}$ value will depend on the particular design of the RF amplifier including the particular LDMOS transistor chosen to implement the design.

The method then proceeds to reference numeral 42 where it is determined whether the transmit request is still true. If the transmit request is still true the method loops through reference numeral 42 until the transmit request is false at which time the method proceeds to reference numeral 44, where the DSP unit instructs the bias circuit to set the $I_{DQ}$ bias to the low value and the method returns to looping through reference numeral 34 until the transmit request again becomes True.

If at reference numeral 38 it is determined that linear operation is not required, the method proceeds to reference numeral 46 where per-band $V_{DD}$ and $I_{DQ}$ levels are set in the power supply 20 and bias circuit 16 respectively. As with the maximum $V_{DD}$ value and the high $I_{DQ}$ value the choice of the per-band $V_{DD}$ and $I_{DQ}$ levels will depend on the particular design of the RF amplifier including the particular LDMOS transistor chosen to implement the design. The method then proceeds to reference numeral 42 where it is determined whether the transmit request is still true. If the transmit request is still true the method loops through reference numeral 42 until the transmit request is false at which time the method proceeds to reference numeral 44, where the DSP unit instructs the bias circuit to set the IDQ bias to the low value and the method returns to looping through reference numeral 34 until the transmit request again becomes True.

Figure 6:
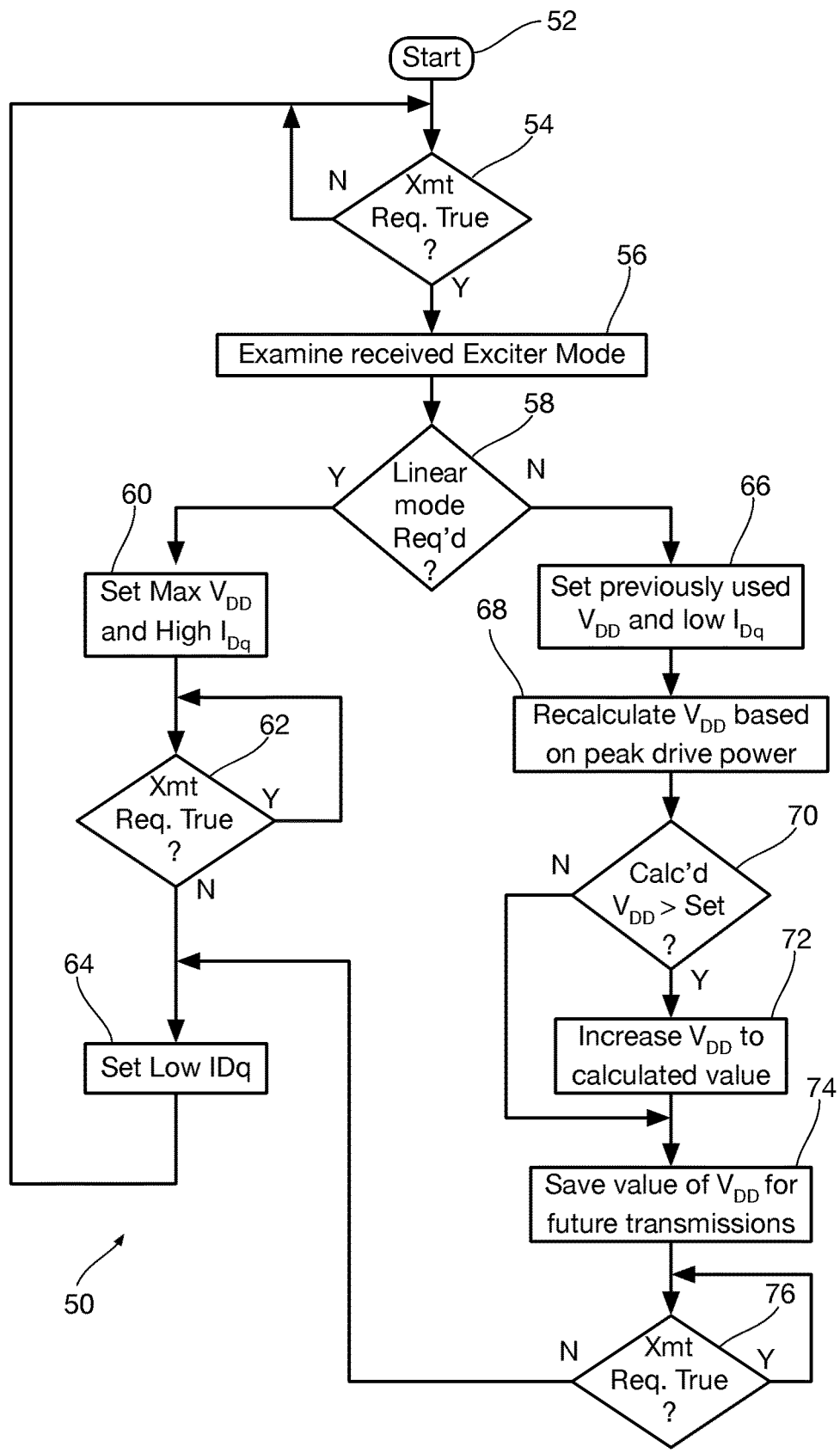
FIG. 6 is a flow diagram showing an illustrative method for operating an RF amplifier for maximum efficiency in accordance with an aspect of the invention.

Referring now to FIG. 6, a flow diagram showing an illustrative method 50 for operating an RF amplifier for maximum efficiency in accordance with an aspect of the invention. According to this method, if the type of emission requires linear mode of operation, the high $I_{DQ}$ bias current and the maximum $V_{DD}$ voltage are set without further changes. If a non-linear mode of operation is satisfactory, low $I_{DQ}$ is set and the $V_{DD}$ power supply voltage remains set to the same value used in the previous transmission. The peak drive power is measured, the necessary $V_{DD}$ power supply voltage level is calculated and the necessary $V_{DD}$ power supply voltage level is calculated based on the peak drive power measurement. If the newly calculated $V_{DD}$ power supply voltage is higher than the current one to which the power supply 20 of FIG. 1 is set, the $V_{DD}$ power supply voltage level is increased. If the newly calculated $V_{DD}$ power supply voltage is lower, then the current $V_{DD}$ power supply voltage level is stored as a new starting value for the next transmission. Upon the end of the transmission, the low $I_{DQ}$ mode is entered. The method begins at reference numeral 52.

At reference numeral 54 the method loops until a transmit request is made (i.e., is "True"). When the transmit request is true, the method proceeds to reference numeral 56 where the DSP unit examines the exciter mode information received from the exciter. At reference numeral 58 it is determined whether the received exciter mode information indicates an exciter mode that requires linear operation (e.g., AM or SSB). If it is determined that the exciter mode requires linear operation, the method proceeds to reference numeral 60 where the DSP unit signals the power supply to set $V_{DD}$ to the maximum value and signals the bias circuit 16 to set the high $I_{DQ}$ value.

The method then proceeds to reference numeral 62 where it is determined whether the transmit request is still true. If the transmit request is still true the method loops through reference numeral 62 until the transmit request is false at which time the method proceeds to reference numeral 64, where the DSP unit instructs the bias circuit to set the IDQ bias to the low value and the method returns to looping through reference numeral 54 until the transmit request again becomes True.

If at reference numeral 58 it is determined that linear operation is not required, the method proceeds to reference numeral 66 where the previously used $V_{DD}$ and $I_{DQ}$ levels are set in the power supply 20 and bias circuit 16 respectively. The method then proceeds to reference numeral 68 where the $V_{DD}$ value is re-calculated based on the peak drive power measured from the exciter. At reference numeral 70 it is determined whether the calculated $V_{DD}$ value is greater than the $V_{DD}$ value that was set at reference numeral 66. If the calculated $V_{DD}$ value is greater than the $V_{DD}$ value that was set at reference numeral 66, the $V_{DD}$ value is increased to the calculated value at reference numeral 72. The method then proceeds to reference numeral 74 where the increased value of $V_{DD}$ is saved for future transmissions. If the calculated $V_{DD}$ value is not greater than the $V_{DD}$ value that was set at reference numeral 66, the calculated value of $V_{DD}$ is saved for future transmissions. The method then proceeds to reference numeral 76 where it is determined if the transmit request is still True. If the transmit request is still true the method loops through reference numeral 72 until the transmit request is false at which time the method proceeds to reference numeral 54, where the method returns to looping through reference numeral 54 until the transmit request again becomes True.

Figure 7:
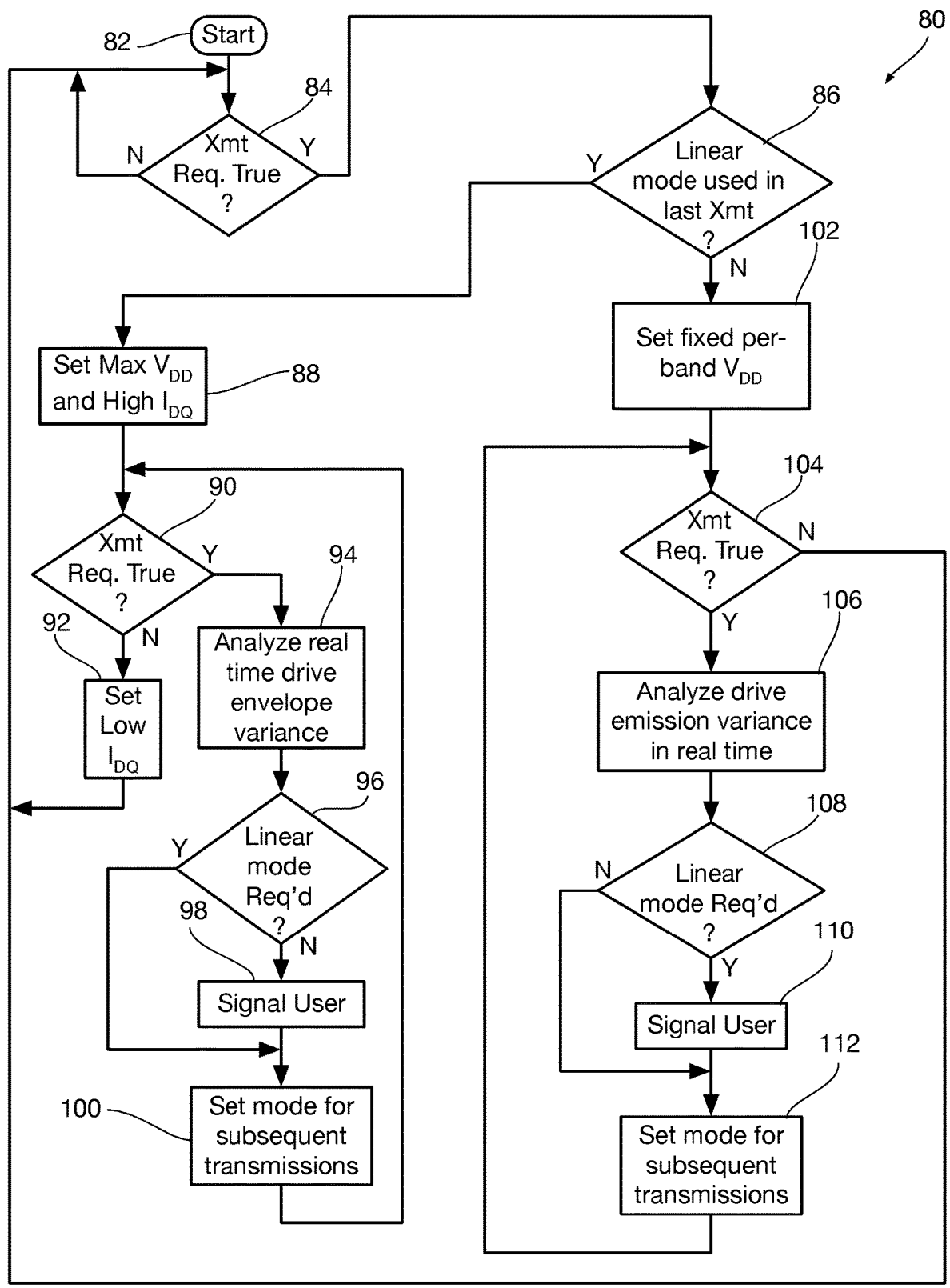
FIG. 7 is a flow diagram showing an illustrative method for operating an RF amplifier for maximum efficiency in accordance with an aspect of the invention.

Referring now to FIG. 7, a flow diagram showing an illustrative method 80 for operating an RF amplifier for maximum efficiency in accordance with an aspect of the invention. This method does not rely on modulation mode information received from the exciter. According to this method, upon the request for transmission, the mode of operation is set to the mode of the previous transmission. The envelope of the drive signal is analyzed. If the type of emission has changed and requires a change in the mode of operation, the user is signalized and the parameters are changed in preparation for the next transmission. The $V_{DD}$ power supply voltage and $I_{DQ}$ are chosen only based on the type of emission. A fixed lower voltage and lower $I_{DQ}$ are used for non-linear operation and the maximum voltage and higher $I_{DQ}$ are used for linear operation. Upon the end of transmission, the low $I_{DQ}$ mode is entered. The method begins at reference numeral 82.

At reference numeral 84 the method loops until a transmit request is made (i.e., is "True"). When the transmit request is true, the method proceeds to reference numeral 86 where it is determined whether the linear mode was used in the last transmission. If the linear mode was used in the last transmission the method proceeds to reference numeral 88 where $V_{DD}$ is set to the maximum level and $I_{DQ}$ is set to the high level. The method then proceeds to reference numeral 90 where it is determined whether the transmit request is still True. If not, the method returns to looping through reference numeral 84 until the transmit request again becomes True.

If at reference numeral 90 it is determined that the transmit request is still True, the method proceeds to reference numeral 94 where variance of the emission envelope is analyzed in real time. The method then proceeds to reference numeral 96 where it is determined if the variance of the emission envelope indicates that linear operation mode is required. If it is determined at reference numeral 96 that linear operation mode is not required, the method proceeds to reference numeral 98 where a signal is sent to the user, for example by displaying an alert on a display screen associated with the amplifier or associated with a computer in communication with the amplifier over a communication link such as, but not limited to, a serial link or an ethernet link. The method then proceeds to reference numeral 100 where the operating mode is set for subsequent transmissions.

If it is determined at reference numeral 96 that linear operation mode is required, the method skips reference numeral 98 and proceeds to reference numeral 100 where the operating mode is set for subsequent transmissions. The method then returns to reference numeral 90.

If at reference numeral 86 it was determined that the linear mode was not used in the last transmission the method proceeds to reference numeral 102 where $V_{DD}$ is set to a per-band voltage value obtained either by analyzing the frequency of the incoming RF envelope or by reading band data received by the amplifier from the exciter.

The method then proceeds to reference numeral 104 where it is determined whether the transmit request is still True. If not, the method returns to looping through reference numeral 84 until the transmit request again becomes True. If at reference numeral 104 it is determined that the transmit request is still True, the method proceeds to reference numeral 106 where drive emission variance is analyzed in real time. The method then proceeds to reference numeral 108 where it is determined if the drive emission variance is such as to require operation in the linear operating mode. If so, the method proceeds to reference numeral 110 where a signal is sent to the user, for example by displaying an alert on a display screen associated with the amplifier or associated with a computer in communication with the amplifier over a communication link such as, but not limited to, a serial link or an ethernet link. The method then proceeds to reference numeral 112 where the operating mode is set for subsequent transmissions.

If it is determined at reference numeral 108 that linear operation mode is not required, the method skips reference numeral 110 and proceeds to reference numeral 112 where the operating mode is set for subsequent transmissions. The method then returns to reference numeral 104 where it is determined whether the transmit request is still true.

Figure 8:
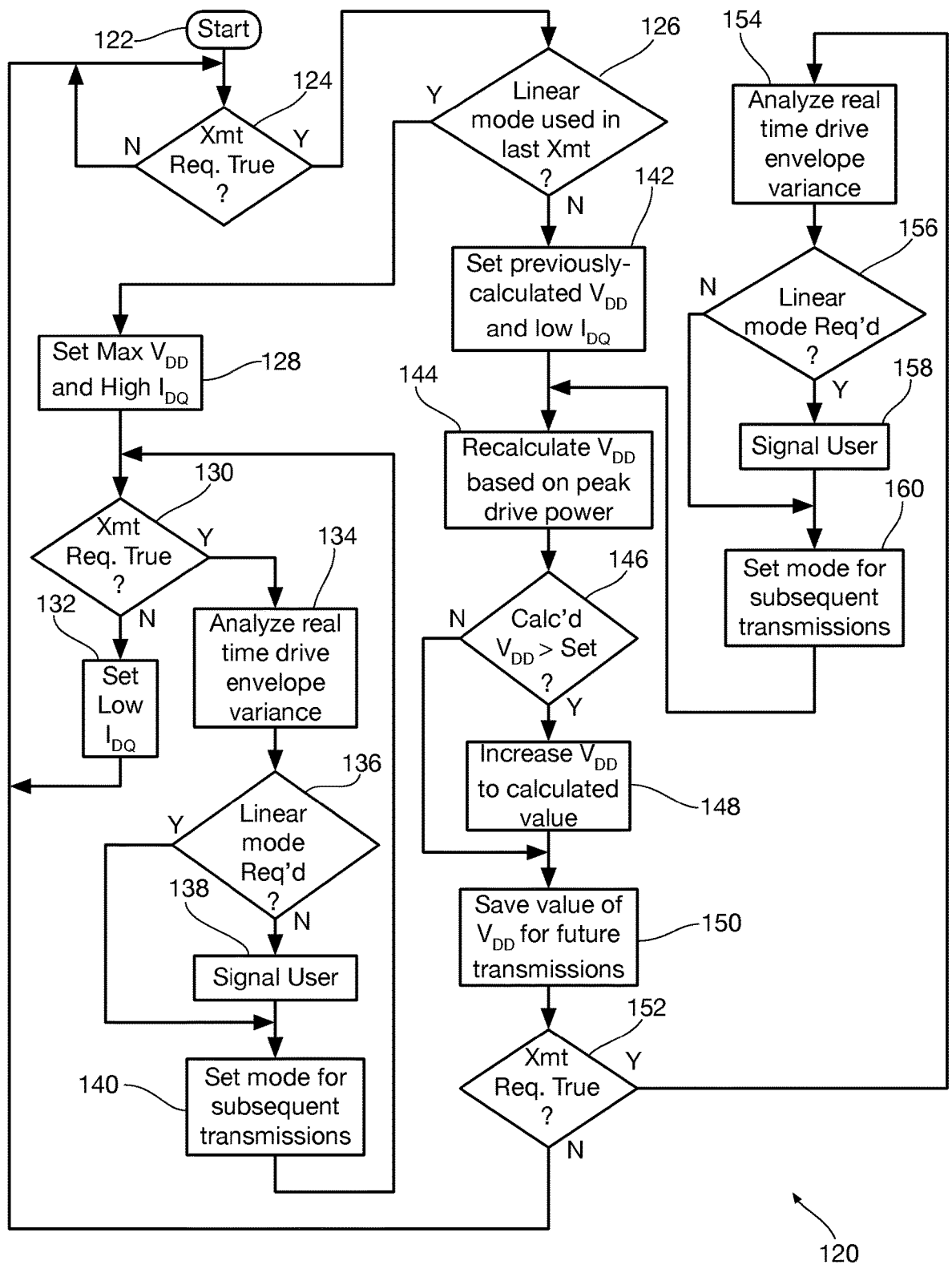
FIG. 8 is a flow diagram showing an illustrative method for operating an RF amplifier for maximum efficiency in accordance with an aspect of the invention.

Referring now to FIG. 8, a flow diagram showing an illustrative method 120 for operating an RF amplifier for maximum efficiency in accordance with an aspect of the invention. This method does not rely on modulation mode information received from the exciter. According to this method, upon the request for transmission, the mode of operation from the last transmission is set. The envelope of the drive signal is analyzed. If the type of emission has changed and requires a change of mode of operation, a signal is sent to the user and parameters are set to prepare for the next transmission. The $V_{DD}$ power supply voltage and $I_{DQ}$ are chosen based on the type of emission and level of drive signal. For a linear mode of operation, the maximum $V_{DD}$ voltage of the power supply voltage and a higher $I_{DQ}$ value are used. For a nonlinear mode of operation, a smaller $I_{DQ}$ is set, and the $V_{DD}$ voltage of the power supply is set as in the method of FIG. 6. The type of input emission is again measured. Based on the type of emission, the necessary $V_{DD}$ power supply voltage is calculated. If the newly calculated $V_{DD}$ voltage is higher than the current one the $V_{DD}$ power supply voltage is increased. If the newly calculated $V_{DD}$ voltage is lower than the current one it is stored as a new starting value for the next emission. When transmission ends the amplifier enters low $I_{DQ}$ mode. The method begins at reference numeral 122.

At reference numeral 124 the method loops until a transmit request is made (i.e., is "True"). When the transmit request is true, the method proceeds to reference numeral 126 where it is determined whether the linear mode was used in the last transmission. If the linear mode was used in the last transmission the method proceeds to reference numeral 128 where $V_{DD}$ is set to the maximum level and $I_{DQ}$ is set to the high level. The method then proceeds to reference numeral 130 where it is determined whether the transmit request is still True. If not, the method returns to looping through reference numeral 124 until the transmit request again becomes True.

If at reference numeral 130 it is determined that the transmit request is not still True, the method proceeds to reference numeral 132 where the bias current IDQ is set to the low value. The method then returns to looping through reference numeral 124 until the transmit request again becomes True.

If at reference numeral 130 it is determined that the transmit request is still True, the method proceeds to reference numeral 134 where the drive envelope variance is analyzed in real time. The method then proceeds to reference numeral 136 where it is determined if the drive emission variance is such as to require operation in the linear operating mode. If not, the method proceeds to reference numeral 138 where a signal is sent to the user, for example by displaying an alert on a display screen associated with the amplifier or associated with a computer in communication with the amplifier over a communication link such as, but not limited to, a serial link or an ethernet link. The method then proceeds to reference numeral 140 where the operating mode is set for subsequent transmissions.

If it is determined at reference numeral 136 that linear operation mode is not required, the method skips reference numeral 138 and proceeds to reference numeral 140 where the operating mode is set for subsequent transmissions. The method then returns to reference numeral 130 where it is determined whether the transmit request is still true.

If at reference numeral 126 it was determined that the linear mode was not used in the last transmission, the method proceeds to reference numeral 142 where $V_{DD}$ is set to the level that was previously calculated at step 144 in the previous transmission and $I_{DQ}$ is set to the low level. The method then proceeds to reference numeral 144 where $V_{DD}$ is recalculated based on the peak drive power measured from the exciter.

At reference numeral 146 it is determined whether the calculated $V_{DD}$ value is greater than the $V_{DD}$ value that was set at reference numeral 142. If the calculated $V_{DD}$ value is greater than the $V_{DD}$ value that was set at reference numeral 142, the $V_{DD}$ value is increased to the calculated value at reference numeral 148. The method then proceeds to reference numeral 150 where the increased value of $V_{DD}$ is saved for future transmissions. If the calculated $V_{DD}$ value is not greater than the $V_{DD}$ value that was set at reference numeral 142, the method skips reference numeral 148 and the calculated value of $V_{DD}$ is saved for future transmissions at reference numeral 150. The method then proceeds to reference numeral 152 where it is determined if the transmit request is still True. If it is determined if the transmit request is not still True the method returns to reference numeral 124 where the method loops until a transmit request is made (i.e., is "True"). If the transmit request is still true the method proceeds to reference numeral 154 where the drive envelope variance is analyzed in real time. The method then proceeds to reference numeral 156 where it is determined if the drive emission variance is such as to require operation in the linear operating mode. If so, the method proceeds to reference numeral 158 where a signal is sent to the user, for example by displaying an alert on a display screen associated with the amplifier or associated with a computer in communication with the amplifier over a communication link such as, but not limited to, a serial link or an ethernet link. The method then proceeds to reference numeral 160 where the operating mode is set for subsequent transmissions.

If it is determined at reference numeral 156 that linear operation mode is not required, the method skips reference numeral 158 and proceeds to reference numeral 160 where the operating mode is set for subsequent transmissions. The method then returns to reference numeral 144 where $V_{DD}$ is recalculated based on the peak drive power measured from the exciter.

In one exemplary embodiment of the invention where the amplifier is configured for operation in the Amateur Radio bands, employs the BLF 188 LDMOS transistor, the lower $I_{DQ}$ is set to 1 A, the high $I_{DQ}$ is set to 2 A, the maximum $V_{DD}$ value (for linear operation) is the same for all bands and is set to 52V. The lower $V_{DD}$ value can be advantageously selected to equalize amplifier gain on different bands. Using the Amateur Radio bands as an example, one embodiment of the invention uses 50V, 50V, 49V, 49V, 49V, 48V, 50V, 50V, 50V, 52V, 52V, respectively, on the 160M, 80M, 60M, 40M, 30M, 20 m, 17M, 15M, 12M, 10M, and 6M bands. The current operating band can either be provided by data provided by the exciter over a communication interface such as CAT, and BCD band out, or by a frequency counter that can be implemented within the DSP unit 22 in a manner known in the art. In situations where the exciter is sending only band information, and there is no modulation information, i.e. when using BCD, the envelope of the driving signal is analyzed by DSP to determine mode of operation (linear/saturated) to be used by the amplifier. Persons of ordinary skill in the art will appreciate that the exemplary $V_{DD}$ voltage and $I_{DQ}$ current values listed herein are for a particular amplifier design, and that $V_{DD}$ voltage and $I_{DQ}$ current values will be different for each individual amplifier design and will easily be determined empirically to provide a desired performance for the particular design in accordance with the principles of the present invention. Graphs like those of FIGS. 2 and 4 for individual LDMOS transistors can be used to determine operating points in any particular embodiment.

Referring again to FIG. 1 an apparatus and a method are provided to protect the RF amplifier 10 against high standing wave ratio (SWR) conditions in accordance with another aspect of the invention. The output of the amplifier 18 is coupled to an output node 162 of the RF amplifier 10 through a first directional coupler 164, a bandpass filter 166, and a second directional coupler 168. The bandpass filter 168 is controllable to allow band selection as is known in the art. The particular configuration of the band selecting feature of the bandpass filter 168 is implemented by a filter band control circuit 170 and details of the filter band control circuit and band selecting feature of the bandpass filter 168 are omitted to avoid overcomplicating the disclosure. Band identifying data may be provided to the filter band control circuit 170 from the exciter over the emission and band data line 26 shown in FIG. 1 that identifies the band on which the exciter is operating.

The first directional coupler 164 has outputs connected to log RF detectors 172. The output of log RF detectors 172 is coupled to DSP unit 22 via connection 174. The second directional coupler 168 has outputs connected to log RF detectors 176. The output of log RF detectors 176 is coupled to DSP unit 22 via connection 178. If a signal from either of the RF detectors 172 or 176 indicates a high SWR condition, the DSP unit can respond by reducing or cutting off the bias and/or $V_{DD}$ voltage from the amplifier 18 to protect the LDMOS transistors from damage.

The first directional coupler 164 senses the SWR between the output of the amplifier 18 and the filters 166. The second directional coupler 168 senses the SWR between the output of the filters 166 and a load (not shown) coupled to the output node 162 of the RF amplifier 10. The first directional coupler 164 protects the amplifier 10 in the event that a failure in the bandpass filters 166 causes a high SWR at the output of the amplifier 18. The second directional coupler 168 protects the RF amplifier 10 in case of a high SWR on a transmission line or load (usually antenna) coupled to the output node 162 of the RF amplifier 10.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for increasing efficiency of a radio frequency (RF) amplifier employing laterally diffused metal oxide semiconductor (LDMOS) transistors coupled to an RF exciter, the method comprising:
   determining an emission mode of modulated RF input signals generated by the RF exciter;
   if it is determined that the emission mode is of a first type where the modulated RF input signals have a continuously varying envelope, applying a first fixed bias current to bias the LDMOS transistors in the RF amplifier for linear operation during an entire time that the modulated RF input signals are being generated; and
   if it is determined that the emission mode is of a type where the modulated RF input signals do not have a continuously varying envelope, applying a second fixed bias current different from the first fixed bias current to bias the LDMOS transistors in the RF amplifier with a fixed quiescent drain current and a fixed drain supply voltage for the LDMOS transistors selected to cause the LDMOS transistors to operate in compression during the entire time that the modulated RF input signals are being generated.

2. The method of claim 1 wherein applying the second fixed bias current to bias the LDMOS transistors in the RF amplifier in compression comprises applying the second fixed bias current to bias the LDMOS transistors at a 3 dB compression point more or less.

3. The method of claim 1 wherein determining the emission mode of modulated RF signals generated by the RF exciter comprises decoding an emission identifier signal communicated to the RF amplifier from the RF exciter.

4. The method of claim 1 wherein determining the emission mode of modulated RF signals generated by the RF exciter comprises processing the modulated RF input signals generated by the exciter to determine the RF emission mode.

5. The method of claim 1 wherein applying the second fixed bias current to bias the LDMOS transistors in the RF amplifier in compression comprises selecting the fixed drain supply voltage for the LDMOS transistors as a function of drive power of the RF modulated input signals and desired amplifier output power.

6. A radio frequency (RF) amplifier comprising:
   an amplifier using at least one LDMOS transistor as an amplifying element to amplify modulated RF signals being provided to the RF amplifier;
   a variable bias current circuit coupled to the amplifier to provide a first fixed bias current and a second fixed bias current to the at least one LDMOS transistor, the second fixed bias current being higher than the first fixed bias current;
   a variable power supply coupled to the amplifier to provide a first fixed drain voltage and a second fixed drain voltage to the at least one LDMOS transistor, the second fixed drain voltage being higher than the first drain voltage; and
   a digital signal processing (DSP) unit coupled to the variable bias circuit and to the variable power supply, the DSP unit configured to:
   cause the variable bias current circuit to provide the first fixed bias current to the at least one LDMOS transistor, and
   cause the variable power supply to provide the first fixed drain voltage to the at least one LDMOS transistor for non-linear mode emissions if the emission mode is of a first type where the modulated RF input signals do not have a continuously varying envelope, and
   cause the variable bias current circuit to provide the second fixed bias current to the at least one LDMOS transistor, and
   cause the variable power supply to provide the second fixed drain voltage to the at least one LDMOS transistor for linear mode emissions if the emission mode is of a second type where the modulated RF input signals have a continuously varying envelope.

7. The RF amplifier of claim 6 wherein the DSP unit is responsive to emission mode data to cause the variable bias current circuit to set one of the first fixed bias current and the second fixed bias current larger than the first fixed bias current to the at least one LDMOS transistor and cause the variable power supply to supply one of a first fixed drain voltage and a second fixed drain voltage higher than the first fixed drain voltage to the at least one LDMOS transistor in response to the emission data provided to the RF amplifier.

8. The RF amplifier of claim 6 wherein the DSP unit analyzes RF emission to cause the variable bias current circuit to set one of the first fixed bias current and the second fixed bias current larger than the first fixed bias current to the LDMOS transistor and cause the variable power supply to supply one of the first fixed drain voltage and the second fixed drain voltage larger than the first fixed drain voltage to the at least one LDMOS transistor in response to analysis of an RF signal provided to the RF amplifier.

* * * * *